US012613269B2

(12) United States Patent
Ramian et al.

(10) Patent No.: US 12,613,269 B2
(45) Date of Patent: Apr. 28, 2026

(54) TEST AND MEASUREMENT INSTRUMENT, TEST AND MEASUREMENT SETUP AND METHOD OF MEASURING A DEVICE UNDER TEST

(71) Applicant: Rohde & Schwarz GmbH & Co. KG, Munich (DE)

(72) Inventors: Florian Ramian, Munich (DE); Karolin Werthmueller, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 126 days.

(21) Appl. No.: 18/604,052

(22) Filed: Mar. 13, 2024

(65) Prior Publication Data

US 2025/0290972 A1 Sep. 18, 2025

(51) Int. Cl.
| | |
|---|---|
| *G01R 31/28* | (2006.01) |
| *G01R 1/04* | (2006.01) |
| *G01R 1/067* | (2006.01) |
| *G01R 1/073* | (2006.01) |
| *G01R 13/02* | (2006.01) |
| *G01R 27/28* | (2006.01) |
| *G01R 27/32* | (2006.01) |

(52) U.S. Cl.
CPC ..... *G01R 31/2834* (2013.01); *G01R 31/2841* (2013.01); *G01R 31/2837* (2013.01)

(58) Field of Classification Search
CPC .............. G01R 31/28; G01R 31/2834; G01R 31/2837; G01R 31/2841; G01R 31/31; G01R 31/3187; G01R 27/28; G01R 27/32; G01R 1/04; G01R 1/067; G01R 1/073; G01R 13/02
See application file for complete search history.

(56) References Cited

U.S. PATENT DOCUMENTS

| | | | | |
|---|---|---|---|---|
| 10,845,401 | B2 * | 11/2020 | Verspecht | G01R 23/163 |
| 11,041,894 | B2 * | 6/2021 | Heuel | G01R 31/2834 |
| 2019/0064233 | A1 * | 2/2019 | Grimm | G01R 13/0218 |
| 2019/0285666 | A1 * | 9/2019 | Peeters Weem | G01R 1/0408 |
| 2022/0163586 | A1 * | 5/2022 | Jin | G06F 11/079 |

OTHER PUBLICATIONS

Verspecht, Dr. J. et al., "Characterizing Amplifier Modulation Distortion Using a Vector Network Analyzer," Keysight Technologies, Inc., California, IEEE, 2019, 4 pages.

* cited by examiner

*Primary Examiner* — Neel D Shah
(74) *Attorney, Agent, or Firm* — CHRISTENSEN O'CONNOR JOHNSON KINDNESS PLLC

(57) ABSTRACT

A test and measurement instrument includes an input configured to receive at least a waveform of a test signal, which includes a plurality of samples. The test and measurement instrument includes a processing circuit connected with the input. The processing circuit is configured to analyze the waveform and to select at least a subset of samples out of the plurality of samples. The subset of samples matches predefined criteria concerning at least one of bandwidth, amplitude distribution, and amplitude percentiles. The test and measurement instrument is configured to generate a modified waveform based on the selected subset of samples and/or to measure only a part of a received measurement signal from a device under test, which corresponds to the selected subset of samples. Further, a test and measurement setup and a method of measuring a device under test are described.

15 Claims, 5 Drawing Sheets

TEST AND MEASUREMENT INSTRUMENT, TEST AND MEASUREMENT SETUP AND METHOD OF MEASURING A DEVICE UNDER TEST

FIELD OF THE DISCLOSURE

Embodiments of the present disclosure relate to a test and measurement instrument for measuring a device under test. Further, embodiments of the present disclosure relate to a test and measurement setup for measuring a device under test. Embodiments of the present disclosure also relate to a method of measuring a device under test.

BACKGROUND

In the state of the art, test and measurement instruments are known that are used for measuring a device under test (DUT), namely characterizing the device under test. For characterizing the device under test in an ideal manner, e.g. how the device under test behaves in real life, a real-world signal is recommended. However, most of the real-world signals are very long, for instance a 5G signal has a frame length of 10 ms and a bandwidth of up to 800 MHz, resulting in more than 10 MSa required for an analysis, e.g. 10 Mega samples (10 Million samples). Since more samples to be taken into account are equivalent to higher computational effort, the overall measurement time increases.

Therefore, it is known in the state of the art to reduce the measurement time by providing a new signal having similar characteristics to the real-world signal.

A common technique is to focus on the bandwidth and crest factor, namely peak-to-average-power-ratio (PAPR), while creating a completely new signal that is used for characterizing the device under test. Alternatively, it is known to use a part of the signal, wherein the power spectrum density (PSD) and the complementary cumulative distribution function (CCDF) are taken into consideration.

Both known solutions however do not provide optimal solutions for characterizing the device under test with regard to its behavior in real life. For instance, non-equivalent measurement results, e.g. for error vector magnitude (EVM), or non-ideal digital pre-distortion (DPD) measurement results are obtained.

Accordingly, there is a need for an improved way of measuring a device under test.

SUMMARY

The following summary of the present disclosure is intended to introduce different concepts in a simplified form that are described in further detail in the detailed description provided below. This summary is neither intended to denote essential features of the present disclosure nor shall this summary be used as an aid in determining the scope of the claimed subject matter.

Embodiments of the present disclosure provide a test and measurement instrument for measuring a device under test. In an embodiment, the test and measurement instrument comprises an input configured to receive at least a waveform of a test signal. The waveform comprises a plurality of samples. The test and measurement instrument also comprises a processing circuit connected with the input. The processing circuit is configured to analyze the waveform received and to select at least a subset of samples out of the plurality of samples. In an embodiment, the selected subset of samples matches predefined criteria concerning bandwidth, amplitude distribution, and/or amplitude percentiles. The test and measurement instrument is configured to generate a modified waveform based on the selected subset of samples and/or to measure only a part of a received measurement signal from the device under test, which corresponds to the selected subset of samples.

Embodiments of the present disclosure also provide a method of measuring a device under test by a test and measurement instrument. In an embodiment, the method comprises receiving at least a waveform of a test signal, wherein the waveform comprises a plurality of samples, analyzing the waveform received, selecting at least a subset of samples out of the plurality of samples, wherein the selected subset of samples matches predefined criteria concerning at least one of bandwidth, amplitude distribution, and amplitude percentiles, and generating a modified waveform based on the selected subset of samples and/or measuring only a part of a measurement signal received from the device under test, wherein the part of the measurement signal received corresponds to the selected subset of samples The technologies and methodologies of the present disclosure are based on the finding that the device under test can be measured in an improved manner by selecting the subset of samples out of the plurality of samples of the waveform of the test signal, wherein the respective subset is selected based on predefined criteria concerning bandwidth, amplitude distribution, and amplitude percentiles of the real world signal. This ensures that the full amplitude distribution characteristic of the real-world signal can be exploited for measuring the device under test. In other words, a proper weighting of the most important amplitudes is taken into account for measuring the device under test. This is of high importance for non-linear devices under test, as those devices deviate from the linear behavior for higher amplitudes.

In an embodiment, the present disclosure relies on three metrics of the real-world signal, namely amplitude distribution, amplitude percentiles and/or bandwidth. For instance, the amplitude distribution and the amplitude percentiles are used for selecting the subset of samples in case of non-linear devices under test.

In contrast to the state of the art, ideal results are obtained, especially for signals with a small number of high amplitude samples, for instance the preamble of Wi-Fi signals. However, this part or section of the signal is very important, as the entire demodulation of the Wi-Fi signal may fail in case the preamble is not represented properly in a pre-distorted signal.

Consequently, the present disclosure relates to a multi-stage approach, as the bandwidth, the amplitude distribution and/or the amplitude percentiles are determined. Also, when taking the amplitude distribution into account, the amplitude probability distribution (APD) may be taken into consideration.

The user of the test and measurement instrument may provide the waveform of the test signal to be used for measuring the device under test. Hence, the test and measurement instrument has an input for receiving the waveform intended for testing. Since the test signal may be long, causing a high number of samples to be taken into account, the processing circuit is capable of processing the waveform associated with the test signal in order to reduce the number of samples. In an embodiment, the processing circuit is configured to analyze the waveform (and the underlying test signal) with regard to bandwidth, amplitude distribution, and/or amplitude percentiles. Based on this analysis, the processing circuit is configured to select a respective subset of the plurality of samples comprised in the waveform, based on which the device under test is measured, e.g. by modifying the waveform to obtain a modified waveform for measuring the device under test or by measuring the device under test only partly, namely only considering a part of the measurement signal received from the device under test.

When selecting the subset of samples, the processing circuit ensures that only those samples are omitted that are not critical with regard to measuring the device under test under real world conditions. Hence, reliable results are obtained while reducing the measurement time accordingly.

In an embodiment, the test and measurement instrument may be an oscilloscope, a signal analyzer or a network analyzer, for instance a vector network analyzer.

An aspect provides that the modified waveform comprises, for example, a smaller amount of samples than the waveform of the test signal. This ensures that the measurement time can be reduced since less samples are taken into account for measuring the device under test. As indicated above, the measurement results obtained are reliable, as the subset of samples is selected such that the subset of samples matches the predefined criteria concerning bandwidth, amplitude distribution and/or amplitude percentiles.

Another aspect provides that the selected subset of samples comprises, for example, samples in a consecutive order. Hence, a respective portion of the waveform is used which comprises several samples rather than several individual samples that are not linked to each other. In an embodiment, all samples of that portion relate to the subset of samples. In other words, no individual sample is omitted in the respective portion. For instance, the waveform has 1000 samples in total, wherein the samples 50 to 100 are selected as the subset of samples from the plurality of 1000 samples.

According to a further aspect, the processing circuit is configured, for example, to divide the waveform into a plurality of segments, wherein the subset of samples is selected from one of the plurality of segments. Each segment comprises several samples, wherein the subset of samples is associated with only one of the segments. Hence, the samples of the subset of samples do not belong to two or more segments, but only to one specific segment.

In an embodiment, the segments all comprise the same amount of samples. In other words, the size of the segments is similar. In an embodiment, the segments may have a size, e.g. length with regard to time, which corresponds to a target length.

Afterwards, the processing circuit is configured to compare the respective metrics, e.g. bandwidth, amplitude distribution and/or amplitude percentiles, for the respective segments against the overall metrics. The respective metrics may be checked in a defined order, e.g. amplitude percentiles first and amplitude distribution second.

In an embodiment, the respective size of the segments may be adapted. In an embodiment, the segments may be narrowed over time towards the target length, e.g. in a stepped manner. The step-size for setting the segments can be optimized over time, e.g. coarse steps first, then fine steps.

Finally, the subset of symbols is selected that fits the overall metrics of the real-world signal best. If no appropriate subset of symbols can be found, an error message may be issued.

Generally, the segments may also be called windows. Hence, the real-world signal may be divided into several windowed portions that are analyzed for selecting the windowed portion of the real-world signal which fits best to the overall real-world signal. As indicated above, the decision is based on the metrics, namely bandwidth, amplitude distribution and/or amplitude percentiles.

For instance, the subset of samples comprises all samples of the segment selected from the plurality of segments. Hence, no sample of the dedicated segment is omitted, as all samples of one segment are selected accordingly.

Generally, the subset of samples comprise samples that are not randomly selected.

According to an embodiment, the input is a digital input via which the waveform is inputted as data. The digital input may relate to a digital port, e.g. a universal serial bus (USB) port, or a network interface such that the waveform is received in a digital manner. Alternatively, the input is provided by a user interface of the test and measurement instrument. A user is enabled to input the waveform via the user interface, e.g. by drawing the waveform on the user interface, for instance on a touchscreen.

In an embodiment, the processing circuit may be configured to generate the modified waveform or wherein the test and measurement instrument may comprise a waveform generation circuit separately formed with respect to the processing circuit, which is configured to generate the modified waveform. The processing circuit itself or the separately formed waveform generation circuit may process the selected subset of samples in order to generate the modified waveform. The modified waveform is reduced with respect to the waveform inputted via the input. Generally, the modified waveform relates to a digital waveform, e.g. digital data, which is processed further in order to obtain a signal.

A further aspect provides that the modified waveform, for example, is forwarded to a waveform output port connectable with an external signal generator device. The modified waveform is outputted via the waveform output port of the test and measurement instrument such that the external signal generator device receives the modified waveform for processing the modified waveform in order to generate a signal based on the modified waveform. The signal generated by the external signal generator device is an analog signal.

According to another aspect, the test and measurement instrument comprises, for example, an internal signal generator circuit that is configured to receive the modified waveform and to generate a signal based on the modified waveform received. In an embodiment, the test and measurement instrument also comprises a signal output port that is connected with the internal signal generator circuit such that the signal generated based on the modified waveform is forwarded to the signal output port. Accordingly, the test and measurement instrument is enabled to generate the analog signal by the internal signal generator circuit, which is forwarded to the signal output port. The signal output port may be connected with the device under test, for example an input of the device under test.

In an embodiment, the (analog) signal generated based on the modified waveform may comprise a digital modulation.

In an embodiment, as the processing circuit is enabled to generate the modified waveform, the processing circuit may comprise a waveform generation sub-circuit.

In an embodiment, the test and measurement instrument may comprise a signal receiver circuit configured to receive the measurement signal from the device under test and to digitize the received measurement signal, thereby obtaining a digitized measurement signal. The signal receiver circuit is connected to an input port of the test and measurement instrument via which the test and measurement instrument is connected to the device under test. Hence, the measurement signal outputted by the device under test is received via the input port and forwarded to the signal receiver circuit. The signal receiver circuit may comprise at least one analog-to-digital converter (ADC) to digitize the measurement signal in order to obtain the digitized measurement signal. The digitized measurement signal can be processed further by the test and measurement instrument, for example with the subset of samples simultaneously.

In an embodiment, the signal receiver circuit may also comprise at least one filter, at least one mixer, at least one amplifier, at least one attenuator and/or at least one I&Q demodulator. For instance, the signal receiver circuit is a sub-circuit of the processing circuit. Accordingly, the processing circuit may be enabled to perform the functionality of the signal receiver circuit. Alternatively, the signal receiver circuit is separately formed with respect to the processing circuit.

Another aspect provides that the test and measurement instrument comprises, for example, a signal analyzer circuit connected with the signal receiver circuit. The signal analyzer circuit is enabled to receive data from the signal receiver circuit, e.g. the digitized measurement signal (at least partly).

In an embodiment, the signal analyzer circuit may be configured to receive the digitized measurement signal from the signal receiver circuit. Hence, the signal analyzer circuit is configured to analyze the measurement signal at least partly. In an embodiment, the entire digitized measurement signal may be forwarded to the signal analyzer circuit or only a part thereof.

For instance, the signal receiver circuit is configured to only forward a part of the digitized measurement signal to the signal analyzer circuit. The forwarded part of the digitized measurement signal corresponds to the selected subset of samples. Accordingly, the signal receiver circuit receives at least information about the selected subset of samples, for example the selected subset of samples directly, in order to adapt the digitized measurement signal with regard to the subset of samples. In other words, the signal receiver circuit may combine information about the subset of samples and the digitized measurement signal prior to forwarding a combined information to the signal analyzer circuit, namely only the part of the digitized measurement signal, which corresponds to the selected subset of samples.

In an embodiment, the signal analyzer circuit is configured to analyze the digitized measurement signal based on the selected subset of samples. Accordingly, the signal analyzer circuit may receive the subset of samples from the signal processing circuit as well as the digitized measurement signal (completely) from the signal receiver circuit, wherein both the subset of samples and the digitized measurement signal are analyzed simultaneously by the signal analyzer circuit. In other words, the signal receiver circuit does not adapt the digitized measurement signal, as the signal receiver circuit does not obtain information about the subset of samples previously.

In an embodiment, the signal analyzer circuit may be a sub-circuit of the processing circuit. Accordingly, the processing circuit may be enabled to perform the functionality of the signal analyzer circuit. Alternatively, the signal analyzer circuit is separately formed with respect to the processing circuit.

Embodiments of the present disclosure also relate to a test and measurement setup comprising a device under test and a test and measurement instrument according to any embodiment described above. In an embodiment, the device under test is connected via an output of the device under test with an input port of the test and measurement instrument such that a measurement signal outputted by the device under test via the output is inputted to the input port of the test and measurement instrument. The test and measurement setup comprises at least two separately formed devices, namely the device under test and the test and measurement instrument.

An aspect provides that the test and measurement instrument comprises, for example, a signal output port connected with an input of the device under test or wherein the test and measurement setup comprises a separately formed signal generator device that is connected with an input of the device under test. According to this specific embodiment, the test and measurement setup comprises three separately formed devices, namely the device under test, the test and measurement instrument and the external signal generator device.

Alternatively, the test and measurement instrument only comprises two separately formed devices, namely the device under test and the test and measurement instrument, wherein the test and measurement instrument comprises the internal signal generation circuit that is capable of generating the signal based on the modified waveform, wherein the signal generated is directly forwarded to an input of the device under test.

An aspect provides that a signal is generated, for example, based on the modified waveform. The generated signal is inputted to the device under test for processing such that the measurement signal from the device under test corresponds to the generated signal. The signal may be generated by the test and measurement instrument itself, namely the internal signal generator circuit that receives the modified waveform, based on which the signal is generated. Alternatively, The signal may be generated by an external signal generator device that is connected with the test and measurement instrument, for example a waveform output port, via which the modified waveform is obtained, based on which the signal is generated. The signal generated by the internal signal generator circuit or the external signal generator device is an analog signal.

Generally, the external signal generator device is separately formed with respect to the test and measurement instrument.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
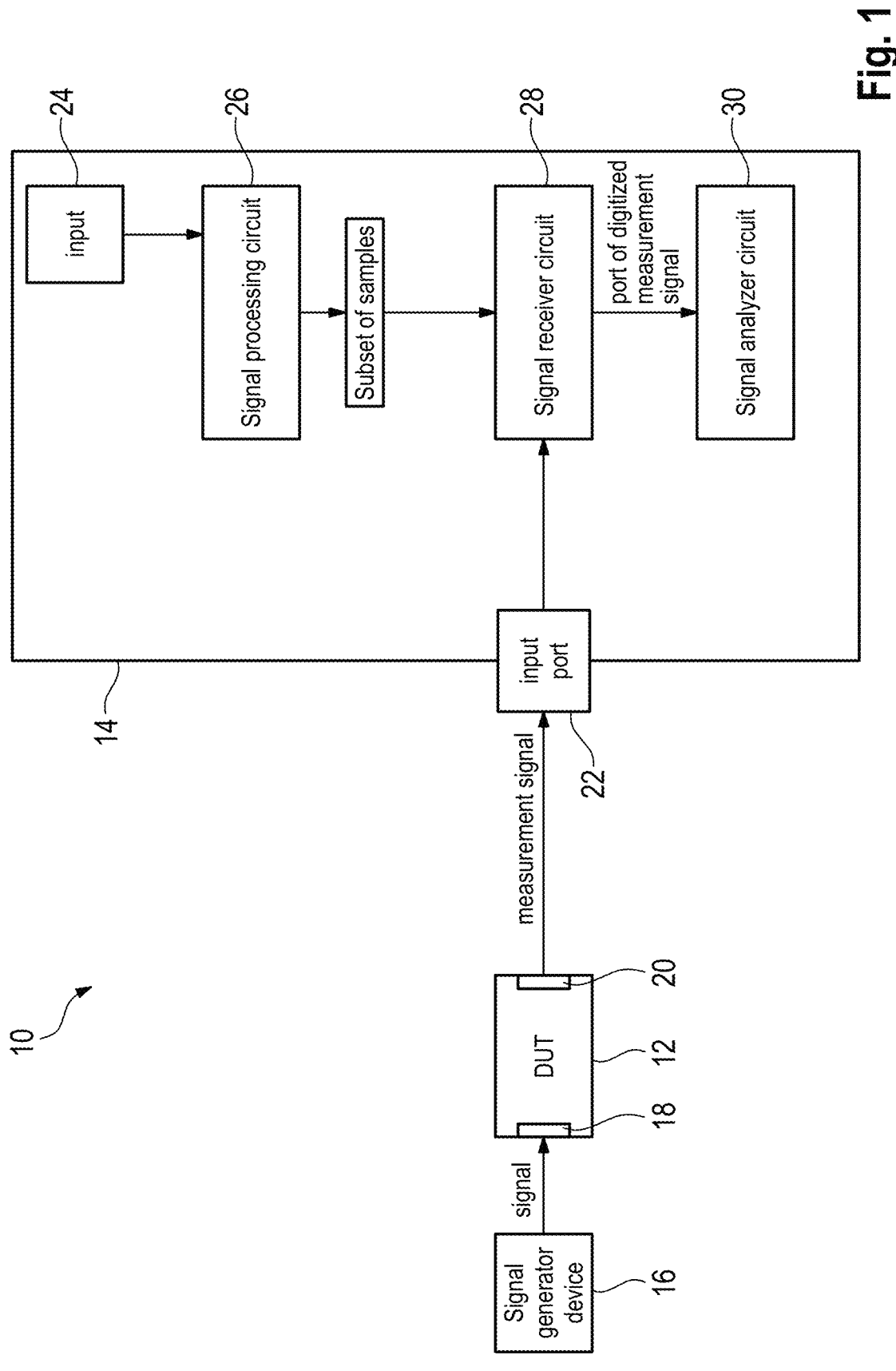
FIG. 1 schematically shows a test and measurement setup according to a first embodiment of the present disclosure, which comprises a device under test and a test and measurement instrument according to an embodiment of the present disclosure.

In FIG. 1, a representative test and measurement setup 10 is shown that comprises a device under test 12, DUT, as well as a test and measurement instrument 14 that is configured to measure the device under test 12, namely to characterize the device under test 12. In the shown embodiment, the test and measurement setup 10 also comprises an external signal generator device 16.

The signal generator device 16 generates a signal that is forwarded to an input 18 of the device under test 12. The device under test 12 processes the signal, thereby generating a measurement signal that is outputted via an output 20 of the device under test 12. The measurement signal outputted is forwarded to an input port 22 of the test and measurement instrument 14 that processes the measurement signal as will be described hereinafter in more detail.

In addition to the input port 22 for receiving the measurement signal from the device under test 12, the test and measurement instrument 14 also has an input 24 for receiving a waveform of a test signal, namely from a user of the test and measurement setup 10. In an embodiment, the input 24 may relate to a digital input via which the user of the test and measurement setup 10, for example the test and measurement instrument 14, may input the waveform of the test signal in a digital manner. For example, the respective input 24 may be a universal serial bus (USB) interface or a network interface such that the waveform of the test signal is received by means of data. Alternatively, the input 24 may relate to a user interface via which the user is enabled to select and/or provide the waveform of the test signal, for instance to draw the waveform on a graphical user interface like a touch screen.

Figure 2:
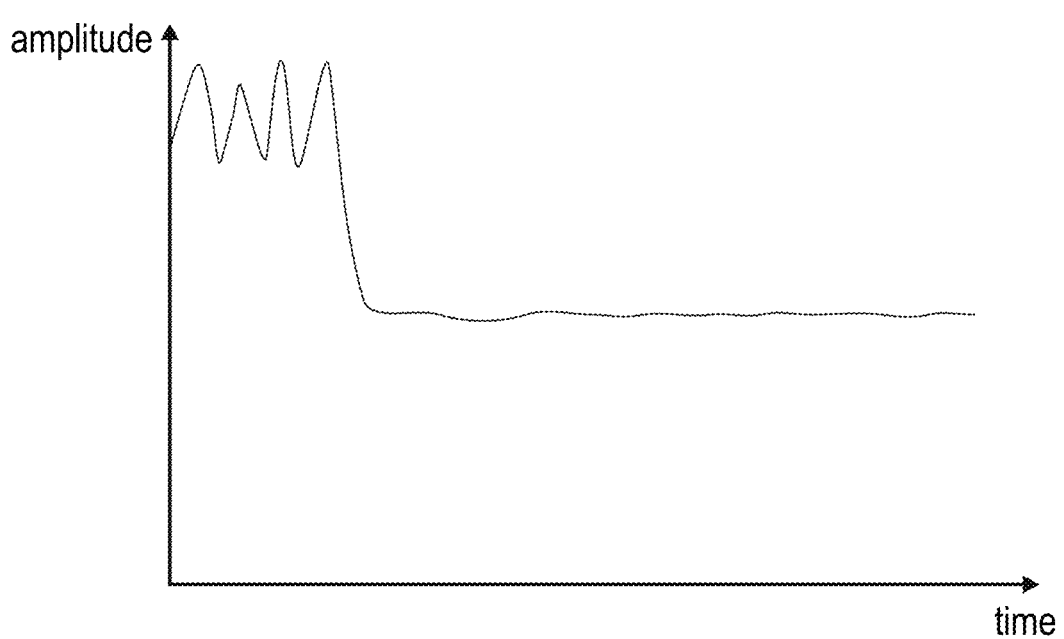
FIG. 2 shows a waveform of a test signal used for measuring the device under test.

Generally, the waveform of the test signal comprises a plurality of samples. In FIG. 2, an example of such a waveform is shown, wherein the waveform relates to a Wi-Fi signal used as test signal. As shown in FIG. 2, the example waveform has a small number of high amplitude samples, namely the preamble, e.g. at the beginning of the waveform.

Returning to FIG. 1, the test and measurement instrument 14 also comprises a signal processing circuit 26 that is connected with the input 24 such that the waveform inputted via the input 24 is forwarded to the signal processing circuit 26 for processing, for example the plurality of samples. The processing circuit 26 is configured to analyze the waveform received, namely the plurality of samples, and to select at least a subset of samples out of the plurality of samples associated with the waveform. In an embodiment, this selection is based on certain criteria concerning bandwidth, amplitude (probability) distribution and/or amplitude percentiles.

In an embodiment, the signal processing circuit 26 analyzes the plurality of samples, namely the entire waveform, in order to identify a certain subset of the samples that ensures a close correspondence to the entire waveform, namely all samples. Put differently, a subset of the plurality of samples is selected which resembles the overall samples the most or in an ideal manner.

In an embodiment of the selection process, metrics are taken into account, namely the bandwidth, the amplitude (probability) distribution and/or the amplitude percentiles. In this embodiment, the subset of the samples is compared with the overall samples based on these metrics.

Figure 3:
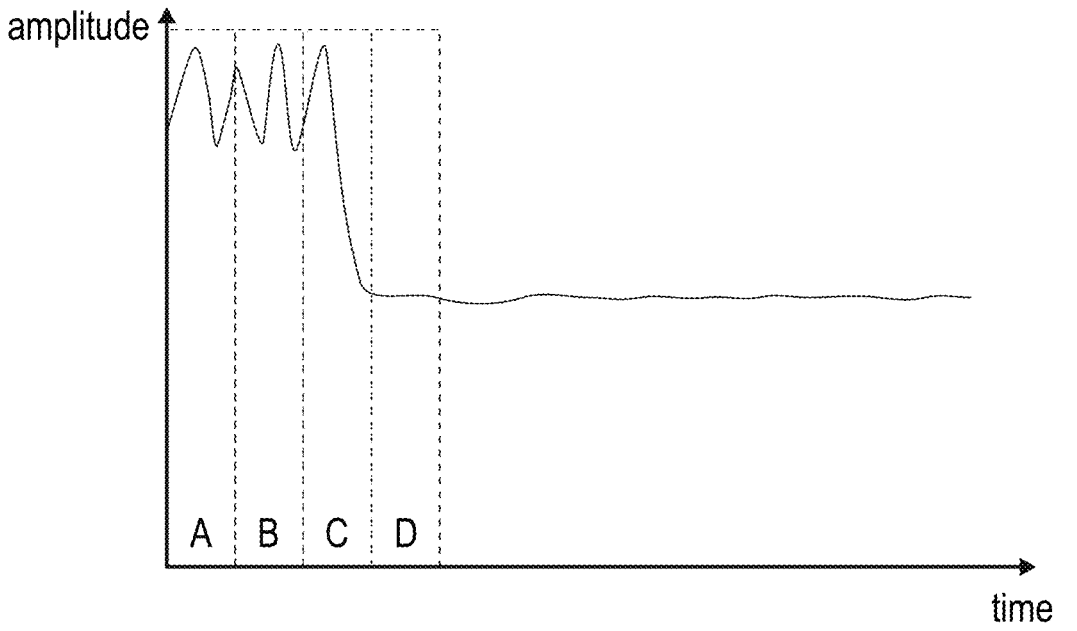
FIG. 3 schematically shows the waveform of FIG. 2 segmented into segments by the processing circuit of a test and measurement instrument according to an embodiment of the present disclosure.

For instance, the waveform, namely all symbols associated with the waveform, are divided by the processing circuit 26 into a plurality of segments that each comprise several samples. In an embodiment, the respective segments may relate to windows such that windowed signal portions or windowed waveform portions are obtained. This is shown in FIG. 3, wherein the waveform of FIG. 2 is segmented into several segments labelled with A to D, respectively.

The respective segments, namely the windowed portions, are compared to the overall waveform with respect to the metrics in order to identify the specific segment having metrics being as close as possible to the overall metrics of the waveform, namely all segments. According to the example shown in FIG. 3, segment C might be selected, as it characterizes the overall waveform most closely. Thus, the respective subset of samples is completely located within segment C. In an embodiment, all samples of segment C relate to the respective subset of samples selected.

In any case, the selected subset of samples comprises samples in a consecutive order. In case the test signal comprises 1,000 samples, wherein the test signal is segmented into 20 segments, for example equally spaced segments, each segment comprises 50 samples. In case, the third segment is selected, the samples 101 to 150 might be selected. Hence, the subset of samples does not relate to randomly or individually selected samples, but to a consecutive order of samples. Consequently, the segments may relate to potential subsets of samples to be investigated for identifying the respective subset of samples that best fits to the overall waveform with regard to the predefined criteria concerning bandwidth, amplitude (probability) distribution, and amplitude percentiles.

The respective comparison for identifying the best-fitting segment or for identifying the subset of samples may be done in a defined order. For instance, the amplitude percentiles are checked first for all of the different segments or all potential subsets of samples. Afterwards, the amplitude (probability) distribution is checked, for example only for those segments being close to the overall metric with regard to the amplitude percentiles, e.g. when reaching and/or exceeding a threshold value concerning the comparison result for the amplitude percentiles.

In the shown embodiment, the subset of samples selected by the signal processing circuit 26 is forwarded to a signal receiver circuit 28 that is configured to receive the subset of samples. The signal receiver circuit 28 is also configured to receive the measurement signal via the input port 22 in the shown embodiment. The signal receiver circuit 28 is configured to digitize the measurement signal received, thereby obtaining a digitized measurement signal.

Accordingly, the signal receiver circuit 28 is configured to process the digitized measurement signal and the selected subset of samples simultaneously. In an embodiment, the signal receiver circuit 28 is enabled to select a part of the digitized measurement signal that matches the selected subset of samples.

In an embodiment, the test and measurement instrument 14 may also include a signal analyzer circuit 30 that is connected with the signal receiver circuit 28 (solely). The signal analyzer circuit 30 is generally configured to analyze the digitized measurement signal at least partly in order to characterize the device under test 12, namely to measure the device under test 12.

The signal receiver circuit 28 is configured to only forward the part of the digitized measurement signal to the signal analyzer circuit 30. Thus, the signal analyzer circuit 30 only analyzes the part of the digitized measurement signal forwarded. Therefore, the device under test 12 is only measured with regard to the selected subset of samples.

In the respective embodiment shown in FIG. 1, the signal receiver circuit 28 relates to a central component of the test and measurement instrument 14, as the signal receiver circuit 28 processes the measurement signal received from the device under test 12 as well as the subset of samples received from the signal processing circuit 26. Hence, the signal receiver circuit 28 is the component that reduces the overall number of samples associated with the measurement signal, as only the part of the digitized measurement signal is forwarded to the signal analyzer circuit 30 for analyzing purposes.

Since the selected subset of samples comprise less samples than the waveform, the computational power required and the measurement time can be reduced effectively.

Figure 4:
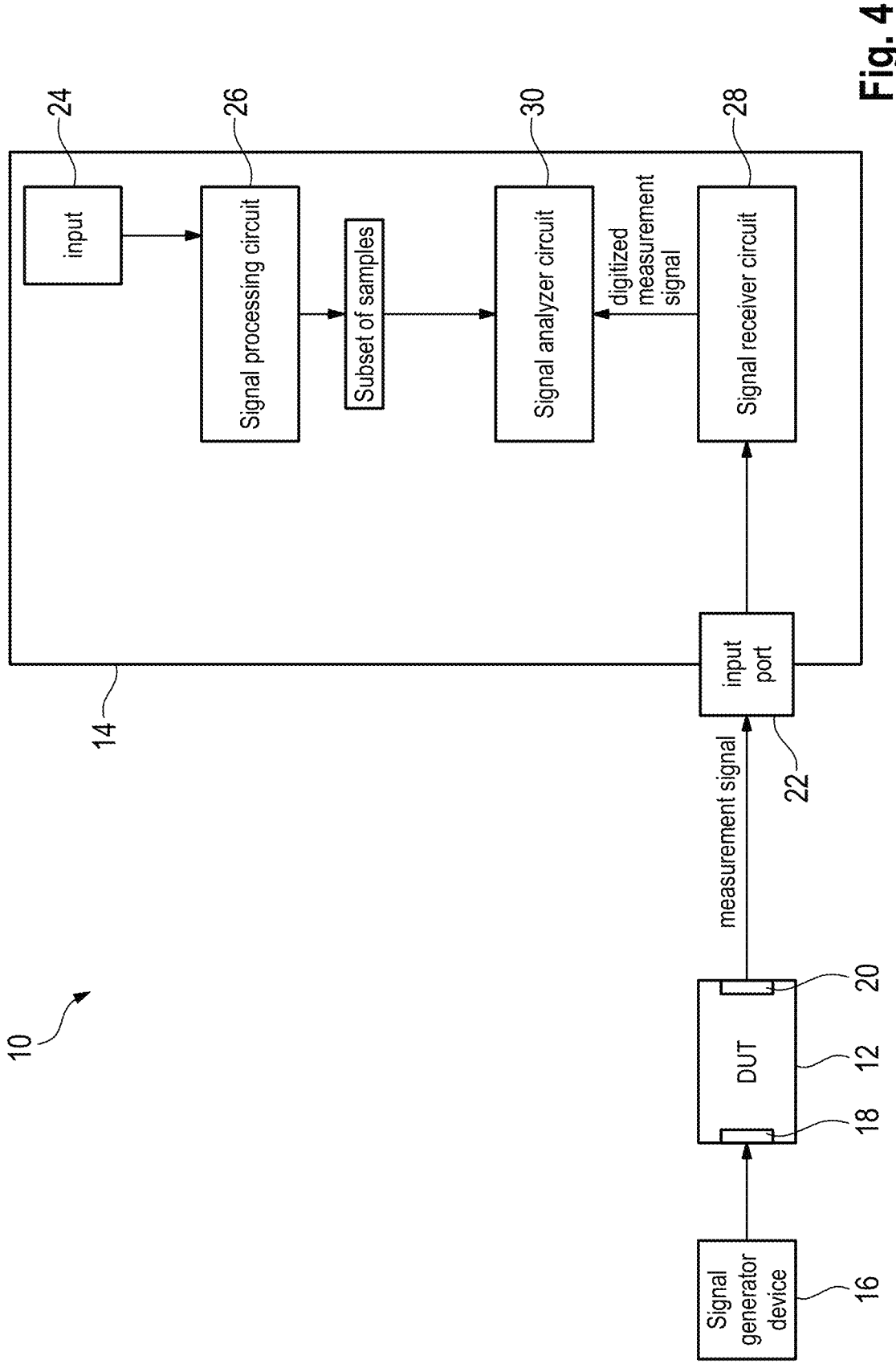
FIG. 4 schematically shows a test and measurement setup according to another embodiment of the present disclosure, which comprises a device under test and a test and measurement instrument according to another embodiment of the present disclosure.

In FIG. 4, another embodiment of a test and measurement setup 10 is shown that comprises the same components as shown in the embodiment of FIG. 1. The difference between the embodiments shown in FIGS. 1 and 4 are described hereinafter in more detail.

As shown in FIG. 4, the signal receiver circuit 28 only receives the measurement signal from the device under test 12 via the input port 22. The digitized measurement signal generated by the signal receiver circuit 28 is completely forwarded to the signal analyzer circuit 30 that is connected with the signal receiver circuit 28. In addition, the signal analyzer circuit 30 is also connected to the signal processing circuit 26 such that the signal analyzer circuit 30 receives both the digitized measurement signal from the signal receiver circuit 28 as well as the subset of samples selected by the signal processing circuit 26.

According to the embodiment shown in FIG. 4, the signal receiver circuit 28 forwards the entire digitized measurement signal to the signal analyzer circuit 30 for analyzing purposes. Then, the signal analyzer circuit 30 takes the subset of samples as well as the digitized measurement signal into account for characterizing/measuring the device under test 12. In other words, the signal analyzer circuit 30 selects the samples from the digitized measurement signal based on the subset of samples received. This selection is done prior to the analysis of the samples selected from the digitized measurement signal such that the number of samples to be analyzed can be reduced prior to the analyzing, thereby reducing the computational efforts and time required.

In both embodiments shown, namely the ones of FIGS. 1 and 4, the signal analyzer circuit 30 only measures the part of the received measurement signal from the device under test 12, which corresponds to the selected subset of samples.

Figure 5:
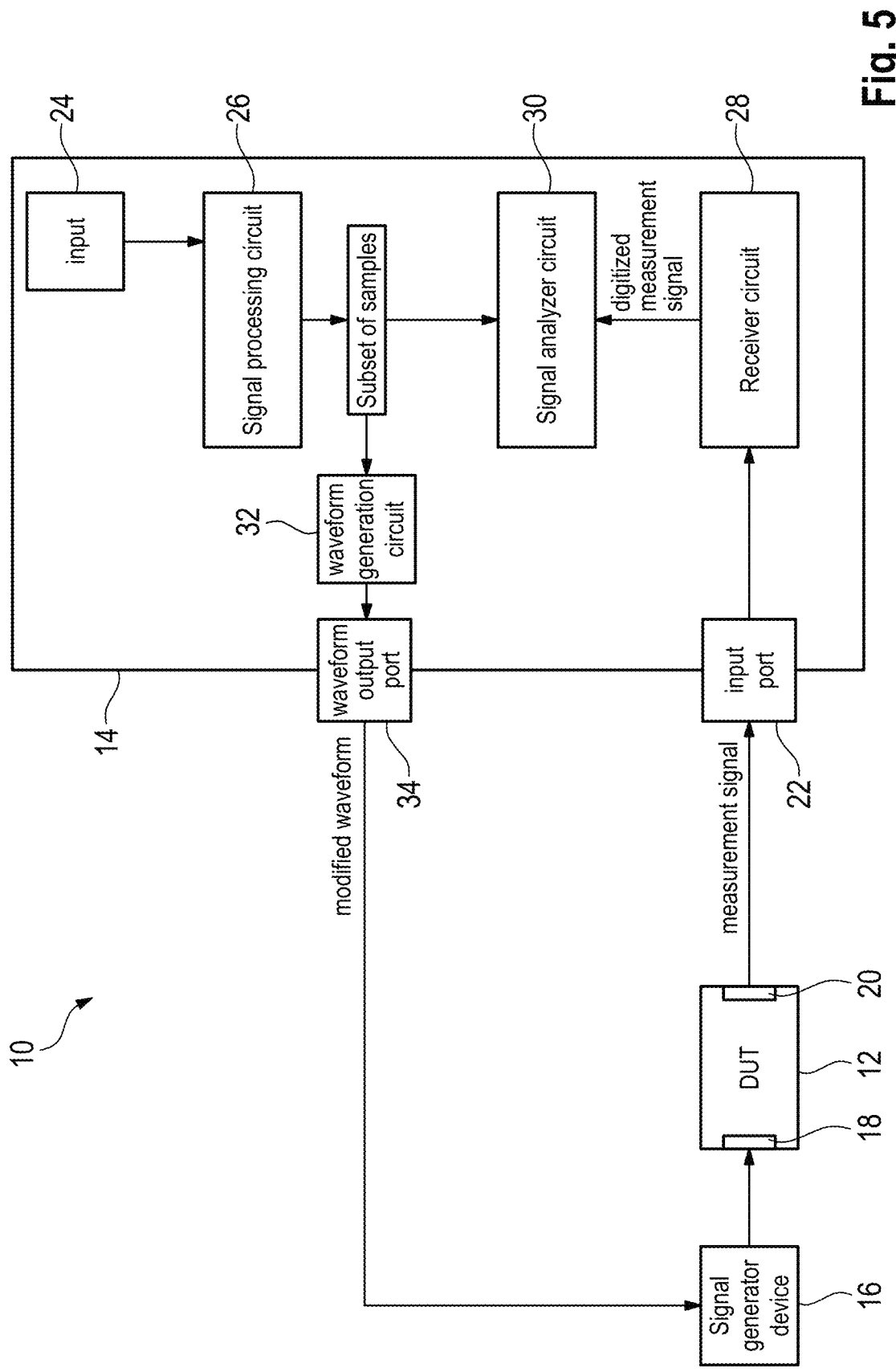
FIG. 5 schematically shows a test and measurement setup according to yet another embodiment of the present disclosure, which comprises a device under test and a test and measurement instrument according to yet another embodiment of the present disclosure, and FIG. 6 schematically shows a test and measurement setup according to still another embodiment of the present disclosure, which comprises a device under test and a test and measurement instrument according to still another embodiment of the present disclosure.

FIG. 5 depicts another embodiment of the test and measurement set up 10. FIG. 5 also depicts the test and measurement instrument 14. The embodiment of FIG. 5 distinguishes from the previous embodiments in that the test and measurement instrument 14 comprises an additional waveform generation circuit 32 that is connected to the signal processing circuit 26. The subset of samples selected by the signal processing circuit 26 is (also) forwarded to the waveform generation circuit 32. In addition, the test and measurement instrument 14 has a waveform output port 34 that is connected to the waveform generation circuit 32.

In general, the waveform generation circuit 32 is enabled to generate a modified waveform based on the selected subset of samples, wherein the modified waveform is forwarded to the waveform output port 34 which is connectable with the external signal generator device 16. Thus, the modified waveform comprises a smaller amount of samples than the waveform of the test signal, namely the waveform initially inputted via the input 24.

In other words, the test and measurement instrument 14 generates a digital waveform that is forwarded to the signal generator device 16 connected with the input 18 of the device under test 12. The signal generator device 16 generates a signal to be forwarded to the input 18 of the device under test 12 based on the modified waveform, namely an analog signal to be processed by the device under test 12.

Consequently, the measurement signal generated by the device under test 12 and forwarded to the input port 22 of the test and measurement instrument 14 corresponds to the signal inputted to the input 18 of the device under test 12, wherein the signal inputted to the input 18 of the device under test 12 is based on the modified waveform which in turn is based on the selected subset of samples. Hence, the measurement signal generated by the device under test 12 is (indirectly) based on the selected subset of samples.

Regarding the further components, reference is made to the embodiment discussed with respect to FIG. 4.

However, since the measurement signal generated by the device under test 12 is (indirectly) based on the selected subset of samples, it is not mandatory that the selected subset of samples is (additionally) forwarded to the signal analyzer circuit 30 as illustrated. Put differently, the test and measurement instrument 14 may also only generate the modified waveform based on the selected subset of samples and forward the modified waveform to the external signal generator device 16 that generates the signal inputted to the device under test 12, which is based on the modified waveform.

Figure 6:
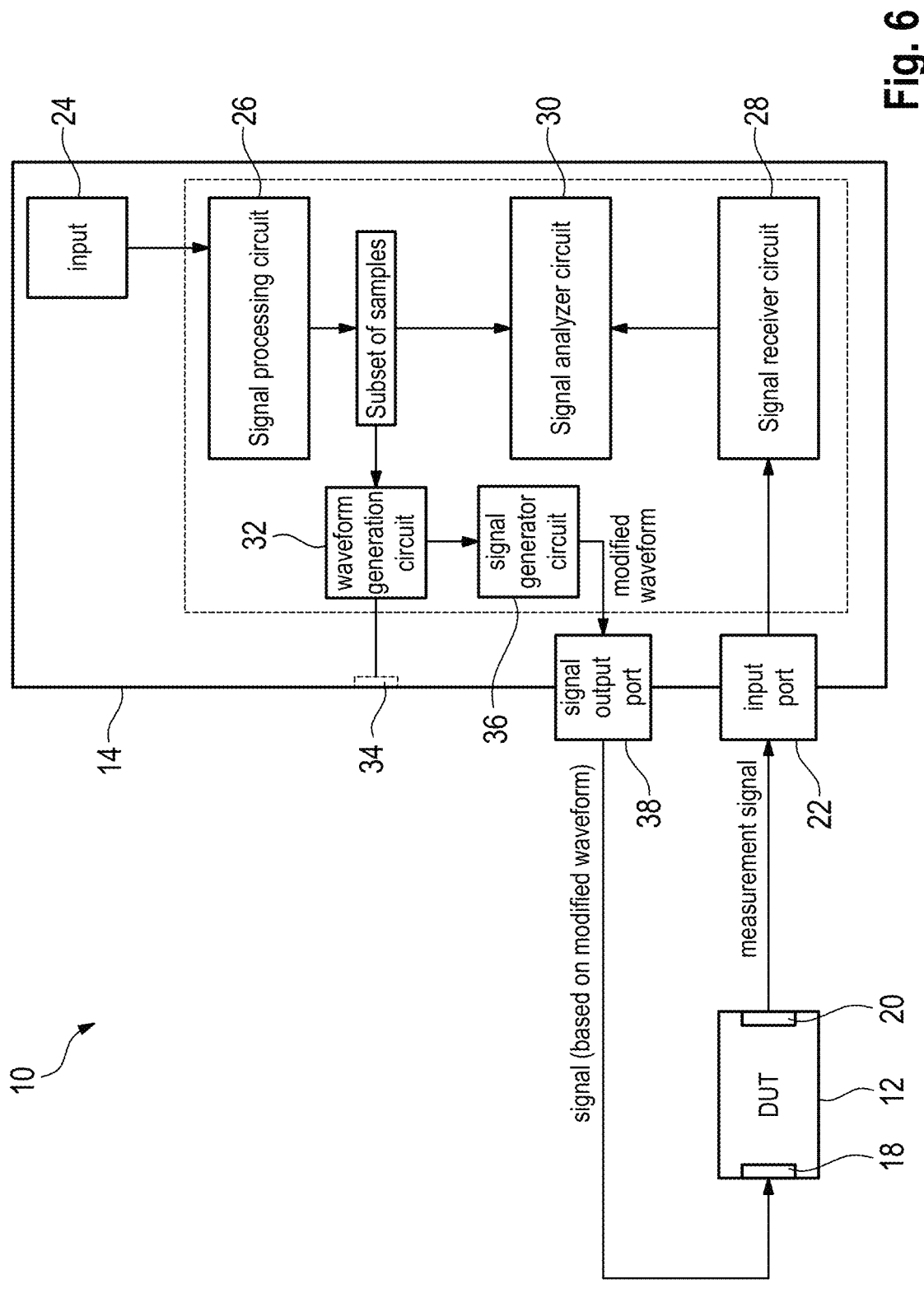

In FIG. 6, another embodiment of the test and measurement setup 10 as well as the test and measurement instrument 14 is shown, which distinguishes from the embodiment shown in FIG. 5 in that the test and measurement instrument 14 has an internal signal generator circuit 36 that is connected to the waveform generation circuit 32. The internal signal generator circuit 36 is configured to generate the analog signal based on the modified waveform received from the waveform generation circuit 32.

Accordingly, the embodiment according to FIG. 6 also distinguishes from the embodiment shown in FIG. 5 in that no external signal generator device 16 is necessary, as the input 18 of the device under test 12 is directly connected with the test and measurement instrument 14. Consequently, the test and measurement instrument 14 has a signal output port 38 via which the signal generated by the internal signal generator circuit 36 is outputted, which is based on the modified waveform. The device under test 12 is directly connected with the signal output port 38 for receiving the analog signal generated.

As illustrated by the dashed lines, the test and measurement instrument 14 may additionally comprise the waveform output port 34 via which the digital modified waveform may be outputted (additionally). Hence, the modified waveform may be forwarded to a separately formed device for further processing if necessary.

Generally and as illustrated by the dashed lines in FIG. 6, the different circuits may relate to a single circuit, namely the signal processing circuit 26. In other words, the waveform generation circuit 32, the signal generator circuit 36, the signal receiver circuit 28 and/or the signal analyzer circuit 30 may be sub-circuits of the signal processing circuit 26. Alternatively, all of these circuits 26, 28, 30, 32, 36 may be separately formed circuits, for example on dedicated chips.

Embodiments of the present disclosure ensure that only the selected subset of samples is used for characterizing/measuring the device under test 12. Hence, the computational power required by the signal analyzer circuit 30 for measuring/characterizing the device under test 12 can be reduced compared to using the overall waveform, namely all samples of the waveform.

Since the selection of the subset of samples is based on metrics like bandwidth, amplitude (probability) distribution and amplitude percentiles, it is ensured that the full amplitude distribution characteristic of the real-world signal can be exploited for measuring the device under test 12.

In an embodiment, a proper weighting of the most important amplitudes of the real-world signal is taken into account when measuring the device under test 12 as discussed above. In an embodiment, this is of high importance for non-linear devices under test 12, as those devices deviate from a linear behavior for higher amplitudes.

When considering FIGS. 2 and 3, the respective differences become evident, as the preamble of a real-world signal as shown in FIG. 2 is of high importance. Thus, neglecting parts of the preamble would result in improper measurement results. The same is true in case samples of the preamble are solely used for measuring the device under test 12.

Consequently, the test and measurement setup 10 as well as the test and measurement instrument 14 ensure fast and reliable characterization of the device under test 12.

Certain embodiments disclosed herein include systems, apparatus, modules, units, devices, components, etc., that utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

For example, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implementing the functionality described herein.

Of course, in an embodiment, two or more of these components, or parts thereof, can be integrated or share hardware and/or software, circuitry, etc. In an embodiments, these components, or parts thereof, may be grouped in a single location or distributed over a wide area. In circumstances where the components are distributed, the components are accessible to each other via communication links.

In an embodiments, one or more of the components, such as device under test 12, the test and measurement instrument 14, the signal processing circuit 26, the waveform generation circuit 32, the signal generator circuit 36, the signal receiver circuit 28, the signal analyzer circuit 30, etc., referenced above include circuitry programmed to carry out one or more steps of any of the methods disclosed herein. In an embodiments, one or more computer-readable media associated with or accessible by such circuitry contains computer readable instructions embodied thereon that, when executed by such circuitry, cause the component or circuity to perform one or more steps of any of the methods disclosed herein.

In an embodiment, the computer readable instructions includes applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably).

In an embodiment, computer-readable media is any medium that stores computer readable instructions, or other information non-transitorily and is directly or indirectly accessible to a computing device, such as processor circuitry, etc., or other circuity disclosed herein etc. In other words, a computer-readable medium is a non-transitory memory at which one or more computing devices can access instructions, codes, data, or other information. As a non-limiting example, a computer-readable medium may include a volatile random access memory (RAM), a persistent data store such as a hard disk drive or a solid-state drive, or a combination thereof. In some embodiments, memory can be integrated with a processor, separate from a processor, or external to a computing system.

Accordingly, blocks of the block diagrams and/or flow-chart illustrations support various combinations for performing the specified functions, combinations of operations for performing the specified functions and program instructions for performing the specified functions. These computer program instructions may be loaded onto one or more computer or computing devices, such as special purpose computer(s), computing device(s), computing circuits or other programmable data processing apparatus(es) to produce a specifically-configured machine, such that the instructions which execute on one or more computers, computing devices, computing circuits or other program-mable data processing apparatus implement the functions specified in the flowchart block or blocks and/or carry out the methods described herein. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure.

Although the method and various embodiments thereof have been described as performing sequential steps, the claimed subject matter is not intended to be so limited. As nonlimiting examples, the described steps need not be performed in the described sequence and/or not all steps are required to perform the method. Moreover, embodiments are contemplated in which various steps are performed in parallel, in series, and/or a combination thereof. As such, one of ordinary skill will appreciate that such examples are within the scope of the claimed embodiments.

In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. In addition, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Thus, it will be appreciated that embodiments of the present disclosure may employ any combination of features described herein. All such combinations or sub-combinations of features are within the scope of the present disclosure.

Throughout this specification, terms of art may be used. These terms are to take on their ordinary meaning in the art from which they come, unless specifically defined herein or the context of their use would clearly suggest otherwise.

The drawings in the FIGURES are not to scale. Similar elements are generally denoted by similar references in the FIGURES. For the purposes of this disclosure, the same or similar elements may bear the same references. Furthermore, the presence of reference numbers or letters in the drawings cannot be considered limiting, even when such numbers or letters are indicated in the claims.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A test and measurement instrument for measuring a device under test, the test and measurement instrument comprising:

an input configured to receive at least a waveform of a test signal, wherein the waveform comprises a plurality of samples;

a processing circuit connected with the input, wherein the processing circuit is configured to analyze the waveform received and to select at least a subset of samples out of the plurality of samples of the waveform received by the input, wherein the selected subset of samples matches predefined criteria concerning at least one of bandwidth, amplitude distribution, or amplitude percentiles, one of a waveform generation circuit or the processing circuit configured to generate a modified waveform based on the selected subset of samples, wherein the modified waveform comprises a smaller amount of samples than the waveform of the test signal, and wherein the test and measurement instrument further comprising one of:

a waveform output port arranged to receive the modified waveform, wherein the waveform output port is connectable with an external signal generator device to which the modified waveform is forwarded for generating a signal based on the modified waveform; or an internal signal generator circuit that is arranged to receive the modified waveform and to generate a signal based on the modified waveform and a signal output port connected to the internal signal generator circuit such that the signal generated based on the modified waveform is forwarded to the signal output port.

2. The test and measurement instrument according to claim 1, wherein the selected subset of samples comprises samples in a consecutive order.

3. The test and measurement instrument according to claim 1, wherein the processing circuit is configured to divide the waveform into a plurality of segments, wherein the subset of samples is selected from one of the plurality of segments.

4. The test and measurement instrument according to claim 3, wherein the subset of samples comprises all samples of the segment selected from the plurality of segments.

5. The test and measurement instrument according to claim 1, wherein the input is a digital input via which the waveform is inputted as data.

6. The test and measurement instrument according to claim 1, wherein the processing circuit is configured to generate the modified waveform or wherein the waveform generation circuit is separately formed with respect to the processing circuit and is configured to generate the modified waveform.

7. A test and measurement setup comprising a device under test and a test and measurement instrument according to claim 1, wherein the device under test is connected via an output of the device under test with an input port of the test and measurement instrument such that a measurement signal outputted by the device under test via the output is inputted to the input port of the test and measurement instrument.

8. The test and measurement setup according to claim 7, wherein the test and measurement instrument comprises a signal output port connected with an input of the device under test or wherein the test and measurement setup comprises a separately formed signal generator device that is connected with an input of the device under test.

9. A method of measuring a device under test by a test and measurement instrument having an input and a processing circuit, wherein the method comprises:

receiving, by the input, at least a waveform of a test signal, wherein the waveform comprises a plurality of samples;

analyzing, by the processing circuit, the waveform received by the input;

selecting, by the processing circuit, at least a subset of samples out of the plurality of samples, wherein the selected subset of samples matches predefined criteria concerning at least one of bandwidth, amplitude distribution, and amplitude percentiles; and generating, by the processing circuit, a modified waveform based on the selected subset of samples, wherein the modified waveform comprises a smaller amount of samples than the waveform of the test signal;

generating a signal based on the modified waveform, the generated signal being inputted to the device under test for processing the generated signal and generating a measurement signal based on the generated signal.

10. A test and measurement instrument for measuring a device under test, the test and measurement instrument comprising:

an input configured to receive at least a waveform of a test signal, wherein the waveform comprises a plurality of samples;

a processing circuit connected with the input, wherein the processing circuit is configured to analyze the waveform received by the input and to select at least a subset of samples out of the plurality of samples of the waveform received, wherein the selected subset of samples matches predefined criteria concerning at least one of bandwidth, amplitude distribution, and amplitude percentiles;

a signal receiver circuit configured to receive a measurement signal from the device under test and to digitize the received measurement signal, thereby obtaining a digitized measurement signal;

a signal analyzer circuit connected with the signal receiver circuit and configured to receive the digitized measurement signal from the signal receiver circuit, wherein the signal receiver circuit is configured to forward only a part of the digitized measurement signal to the signal analyzer circuit, and wherein the forwarded part of the digitized measurement signal corresponds to the selected subset of samples such that the test and measurement instrument is configured to measure only the selected subset of samples.

11. The test and measurement instrument according to claim 10, wherein the signal receiver circuit is a sub-circuit of the processing circuit.

12. The test and measurement instrument according to claim 10, wherein the signal analyzer circuit is configured to analyze the digitized measurement signal based on the selected subset of samples.

13. The test and measurement instrument according to claim 10, wherein the signal analyzer circuit is a sub-circuit of the processing circuit.

14. A test and measurement setup comprising a device under test and a test and measurement instrument according to claim 10, wherein the device under test is connected via an output of the device under test with an input port of the test and measurement instrument such that a measurement signal outputted by the device under test via the output is inputted to the input port of the test and measurement instrument.

15. The test and measurement setup according to claim 14, further comprising a signal output port connected with an input of the device under test or wherein the test and measurement setup comprises a separately formed signal generator device that is connected with an input of the device under test.

* * * * *